United States Patent [19]

Marcantonio

[11] B 4,000,054
[45] Dec. 28, 1976

[54] METHOD OF MAKING THIN FILM CROSSOVER STRUCTURE
[75] Inventor: Gabriel Marcantonio, Ottawa, Canada
[73] Assignee: Microsystems International Limited, Montreal, Canada
[22] Filed: Mar. 2, 1972
[21] Appl. No.: 231,416
[44] Published under the second Trial Voluntary Protest Program on March 30, 1976 as document No. B 231,416.

Related U.S. Application Data

[63] Continuation of Ser. No. 87,542, Nov. 6, 1970, abandoned.
[52] U.S. Cl. ............................ 204/192; 29/625; 174/68.5; 317/101 CE; 357/71; 427/99
[51] Int. Cl.² ..................................... C23C 15/00
[58] Field of Search ............... 174/68.5, DIG. 3; 317/101 A, 101 CE, 101 CM; 29/625; 117/217, 213; 357/71, 54

[56] References Cited
UNITED STATES PATENTS

| 3,377,513 | 4/1968 | Ashby et al. | 317/101 CE |
| 3,508,325 | 4/1970 | Perry | 317/101 A X |
| 3,525,617 | 8/1970 | Bingham | 317/101 CE X |

*Primary Examiner*—Darrell L. Clay
*Attorney, Agent, or Firm*—Sidney T. Jelly

[57] ABSTRACT

This invention is a structure of, and method of forming, a thin film conductor which crosses either a thin film or thick film glazed circuit underlying structure. A selected low temperature curing insulative dielectric is disposed over a conductor which is to be crossed, and a thin film conductor passes over the dielectric and is in contact with ends of two other conductors, providing a conductive bridge over, and insulated from the underlying conductor.

4 Claims, 7 Drawing Figures

METHOD OF MAKING THIN FILM CROSSOVER STRUCTURE

This is a continuation of application Ser. No. 87,542, filed Nov. 6, 1970 now abandoned.

This invention relates to the structure of a thin or thick film circuit, and particularly to the provision of conductive bridges or crossovers over conductors or resistors of the circuit.

It has long been the goal of thin and thick film circuit designers to be able to form conductive crossovers between pairs of conductive paths lying adherent to a substrate, over other conductive paths, while being insulated from the latter. This would allow the design of more complex circuits than previously possible.

One type of structure to which crossovers may be applied is commonly called a "thick film", "cermet", or "glazed" circuit. In this structure, a frit of metallic particles dispersed in a carrier is applied to the surface of a substrate such as glass or ceramic in a predetermined layout. The frit is then fired, to glaze and bond it to the substrate. Typically the firing takes place at a temperature of about 1,000° centigrade in order that glass in the carrier is heated above its melting temperature, and thus fuse when cooled.

In the thick film structure, on which additional thin film resistive elements such as those made of tantalum are to be deposited, for instance by sputtering in a conventional manner, the firing stage must have been completed prior to the sputtering stage. Otherwise, if the unit is fired after the thin film resistive elements are deposited, the resistive elements would be destroyed.

Under ordinary circumstances this problem would not appear difficult to solve, since the firing and sputtering stages may be done successively. However, the problem becomes more significant when conductive crossovers are to be produced. In this case, a thick film conductive pattern is laid down, for instance by conventional screening; then the combination is fired. An insulative dielectric made of glassy material is then deposited where the crossovers are to be placed, and the entire unit is fired again. As a last stage, thick film crossover conductors are deposited, and the unit fired again. Should the requirement exist to deposit thin film resistors or conductors, this may be done only as a last stage since a subsequent firing would destroy the thin film. Canadian Pat. No. 843,632 to H. Abrams, issued June 2, 1970, describes the above-mentioned process in more detail.

Thus it may be seen that the production of crossovers requires many stages of processing, which results in undesirably high costs and reduced yield of satisfactory product.

Another problem associated with production of crossovers results from the temperature coefficients of expansion of the materials used as the substrates and the crossover dielectric. If the coefficients differ substantially, the expansion differential of the two materials are often sufficiently great to crack the conductive crossovers over the dielectric, introducing either open circuits or unreliable conductive paths. For this reason the crossover dielectric is usually made of a material similar to that of the substrate, for instance a glass-based frit which has a similar temperature coefficient of expansion as the glass or ceramic substrate. Consequently the expansion of the materials is approximately the same, resulting in a reliable crossover path. Firing of the material is thus required to glaze this type of material and render it permanent.

Typically, thin film crossover elements are less than 30,000 angstroms in thickness, and with the crossover dielectric having a thickness of the order of thousandths or hundredths of an inch, it may be seen that a thin film conductive element rides over the dielectric in generally similar proportion as a long strip of tape rides over a hill. With temperature-caused expansion of the dielectric, the fragility of the structure thus becomes obvious.

In summary, the three main problems described above associated with the production of crossovers are:

a. a restriction in the variety of crossover dielectric materials to types similar to the substrate;
b. since these materials are thus restricted to glassy and ceramic types, the requirement of use of a high firing temperature for glazing; and
c. the destruction of thin film type material which may be laid down prior to firing, by the heat of firing. This inefficiently restricts the deposition of the thin film material to the last stage in the process, and also requires that a large number of process steps be used.

Since glassy crossover dielectrics must be fired, their use is restricted to the thick film type circuit as described in the Abrams patent referred to above. Totally thin film circuits could not be produced with crossovers of this type since if a thin film underlying layer is first deposited, the later glazing of the crossover dielectric would vaporize it.

One structure used to overcome the above-mentioned limitation with respect to thin film circuits involves the use of conductive strips adherent to flexible thin plastic sheets. A sheet is laid completely over the substrate carrying a thin film circuit, and various portions of the conductive strips are fastened to land areas on the substrate. While this structure produces the desired crossovers, there appears to be little economic labor advantage over conventional point to point wire bonding.

Another approach to solve the problem involves building up the lands to which crossover and other connections are to be made, by means of posts or mesas. A dielectric film such as TEFLON (trademark) is pressed flat on a substrate carrying a thin film circuit, holes being forced through the film at the posts or mesas. Cross connection paths are then deposited over the surface of the dielectric film, making contact to the posts according to a predetermined layout.

However, this approach also involves a large number of process steps to build up the mesas or posts, as well as to impress the plastic film over the substrate.

In this invention I have been able to produce thin film crossover conductors applied to thin or thick film circuits on glass or ceramic substrates which are highly reliable, and which are relatively inexpensive to produce, since processing labor is reduced substantially from the earlier structures described above. Virtually all resistive and conductive paths in a thin film circuit may be deposited upon the substrate in the normal manner prior to forming the crossover. After the crossover dielectric is formed, no firing is required, and the crossover conductor may be deposited over the dielectric in a normal manner as if deposited on the substrate itself.

Only three basic steps are required: the deposition of conductive, capacitive, or resistive elements on the substrate; the deposition of the crossover dielectric, and the deposition of the crossover conductor or resistor. The crossover dielectric may be deposited by the conventional screening-through-mask technique. Consequently, my invention allows the production of more complex low-cost and reliable thin film and hybrid thin and thick film circuits than could be produced before.

The advantages of this invention were obtained by discovering certain suitable dielectric materials which do not require firing, are simple to apply, have a proper dielectric constant range, and have sufficient resiliency as to negate any ill-effects brought on by temperature-caused differential expansion between the dielectric and the substrate. The advantages are obtained by providing a thin film circuit comprising an electrically insulative substrate, first, second, and third conductive elements bonded to the substrate, the first element being disposed between said second and third elements, a low temperature curing resilient insulative dielectric overlying the first conductive element and bonded to the substrate to provide an electrically insulating crossover path, and a thin film conductive element extending over the dielectric between, and in contact with, the second and third conductive elements, bonded to said dielectric.

The term "low temperature curing" dielectric in this specification is used in a special sense, to indicate that the dielectric cures under temperature conditions lower than that which would damage the thin film circuit, for instance by changing the value of resistors, by causing breakdown of the dielectric of a thin film capacitor, or the like. The term is not intended to require that it is temperature alone which causes curing of the dielectric; cure may be obtained by a catalyst, by exposure to moisture, by drying, or any other conventional manner except excessive heating such as firing.

A more detailed understanding of the invention may be obtained by reference to the figures referred to below:

Figure 1:
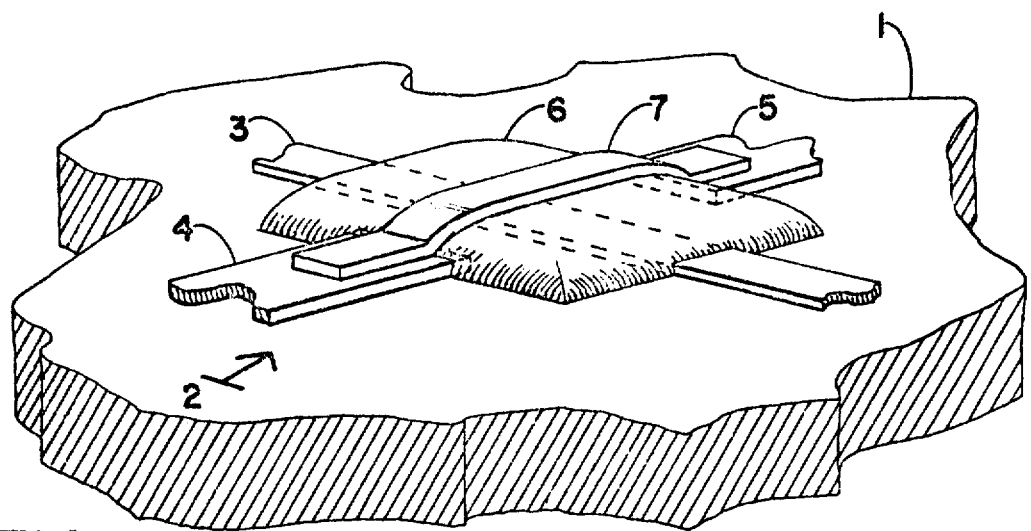
FIG. 1 is an enlarged perspective view of a single crossover structure.

FIG. 1 shows an enlarged perspective view of a single crossover. A substrate 1 such as may be manufactured of glass or ceramic has a thin film circuit 2 deposited on its surface. The thin film circuit adherent to the substrate may be made up of capacitors, resistors, conductors, etc., as in a well known structure.

In the example shown, it is desired to allow first conductive element 3 to follow a particular physical path, and to provide a conductive crossover over the first conductive element 3, insulated therefrom.

In this structure, in order to provide a crossover, a second conductive element 4 follows a path up to, but does not touch, the first conductive element 3. On the other side of the first conductive element a third conductive element 5 is disposed opposite the second conductive element 4, but also does not touch the first conductive element 3.

A low temperature curing resilient insulative dielectric 6 is located over the first conductive element 3 between the second and third conductive elements 4 and 5, but preferably overlaps the latter elements to some extent.

The particular group of dielectric materials which have been found to have the required properties of low temperature curing, electrical insulation, resiliency, and temperature coefficient of expansion are silicone resin, silicone rubber, epoxy and urethane.

A thin film conductive element 7 is located over the dielectric 6 and in electrical contact with the second and third conductive elements 4 and 5, forming a crossover conductor. Since the thin film conductive element 7 is in contact with elements 4 and 5, a completely conductive path is formed from element 4 to element 5 insulated from first conductive element 3 by dielectric 6. The dielectric also physically supports thin film conductive element 7.

The method of construction of the crossover will now be described with reference to FIGS. 2A, 2B, 2C and 2D. A substrate 1 made of glass or ceramic, such as berryllia or alumina, is cleaned and then subjected to sputtering of conductive and/or resistive materials in a well known manner. The resultant patterns are then defined by photolithography and etching. The materials evaporated may be those selected from the group consisting of gold, a layer of nichrome used as an adhesive followed by a layer of gold (commonly called nichrome-gold), tantalum, aluminum, copper, nichrome, silver, palladium, titanium, chromium, platinum, and nickel. Of course, other conventional methods of depositing and defining the conductive and resistive patterns may be used.

Figure 2A:
FIGS. 2A, 2B, 2C and 2D show a section of a thin film circuit in successive stages of the production of a crossover.
Figure 2B:
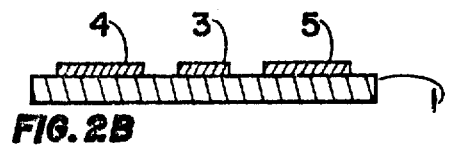
Figure 2C:
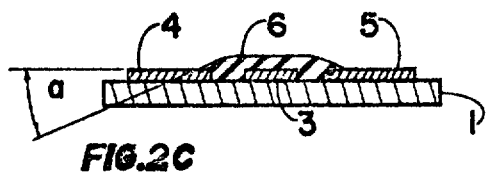
Figure 2D:
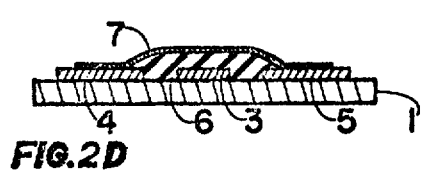

In FIG. 2B, the thin film circuit is shown adherently deposited, comprising first conductive element 3, which is to be crossed, and second and third elements 4 and 5 which are to be conductively connected over element 3. Elements 3, 4 and 5 may all be deposited and defined at the same time, or alternatively, may be deposited and defined in subsequent steps if their character requires it. It is usual that the thin film conductive elements 3, 4 and 5 are less than 30,000 angstroms thick, for instance typically 5,000 angstroms, and therefore it may be seen that the thickness proportions shown in FIGS. 2A to 2D are distorted vertically for clarification purposes.

The dielectric material is then deposited through a mask and a screen, a useful mesh being a No. 325. The dielectric material should be chosen from the group consisting of silicone resin, silicone rubber, epoxy and urethane. Screen printing of the dielectric appears to clear it of entrapped air bubbles, which further ensures the reliability of the dielectric. However, it may be found necessary to remove bubbles caused by preparatory mixing of the dielectric material prior to screening by placing the material in a vacuum.

The dielectric 6 should be deposited so as to overlie the first conductive element 3, and preferably bridge over a portion of second conductive element 4 and third conductive element 5. The thickness of the dielectric material overlying the first conductive element 3 may be any thickness consistent with capacitance requirements and potential breakdown strengths, but typically may be between 0.0015 and 0.002 inches at the thickest point.

The dielectric material is then cured, for instance by simply allowing it to stand, or by heating slightly which may hasten the curing process, if the material is normally cured by heating.

A thin film conductive element 7 is then deposited, for instance by evaporation through a mask, over the dielectric 6, in contact with second and third conductive elements 4 and 5. The thin film conductive element 7 may be made of similar materials as elements 3, 4 and 5. Alternatively, element 3, elements 4 and 5 or elements 3, 4 and 5 may be of thick film material such as the frit described earlier, while conductive element 7 is of thin film material.

A specific example of a circuit made by the method outlined above will be described below.

A substrate of 99.6% pure alumina, manufactured by Duplate Corporation was cleaned in a well known manner. A 1,000 angstrom layer of tantalum was then sputtered over the whole surface. Specific resistors were then defined by photolithography and etching, in a well known manner. Nichrome gold was then evaporated over the entire surface, and specific conductors defined by conventional photolithography and etching. In order to deposit the conductive layer, first 500 angstroms of nichrome alloy were evaporated as an adhesive for the gold, then 7,000 angstroms of gold were deposited directly over the nichrome. The nichrome-gold areas after being defined by photolithography and etching, overlapped the ends of the resistors and provided predetermined conductive paths therebetween, and also defined terminals for external connections, connection of integrated circuits, crossovers, etc.

Where the paths of the nichrome-gold were required to cross over one or more other conductors or resistors, gaps in the conductive paths were left by blocking of the etching, by the photoresist mask. A dielectric of SYLGARD 187 (trademark) resin of Dow Corning Ltd. was then screen printed through a masked screen having a No. 325 mesh, over the conductive paths which were to be crossed, and overlapping the adjacent ends of the gapped conductive paths to a slight extent. The width of the mask opening was typically 0.03 inches × 0.06 inches for screening of the dielectric.

The entire assembly was then placed in an oven at 100° centigrade for one hour, in order to cure the SYLGARD 187 dielectric. It has been found that this temperature will not harm the metallic or resistive thin film depositions already adherent to the substrate. Alternatively, this dielectric could have been cured for 4 hours at 65° centigrade, or 3 days at 20° centigrade.

The crossover conductors were then evaporated through a 0.001 inch thick kovar mask. A 500 angstrom layer of nichrome was first evaporated across the dielectric, in contact with the exposed portions of the gapped conductive paths. Through the same mask, an 8,000 angstrom layer of gold was then deposited over the nichrome. The nichrome-gold crossover conductors should be narrower than the widths of the deposited dielectric, but long enough to contact the ends of the gapped conductive paths.

It was found that among 34 crossovers on a substrate 2 inches to a side, there were no failures when the entire assembled unit was thermally shocked five times between −55° centigrade and +70° centigrade. Consequently, it may be seen that due to the resilience of the material and the small expansion differential between the dielectric and the substrate, no tearing of the thin film crossover occurred. While the circuit had not been sealed, subsequent conventional sealing of the thin film circuit further contributes to the physical stability and adhesion of the entire crossover structure.

It was also found that the leakage current between the crossover conductor and the first underlying conductive element was $5 \times 10^{-15}$ amperes, and the capacitance therebetween was 0.27 picofarads at 1 MHz.

In thick film technology, thick film conductors are known to function best when they have as nearly a rectangular cross section as possible. This results in the glassy crossover dielectric having similar configuration, meeting the substrate at a relatively sharp angle. If this dielectric were used where thin films form the crossover conductors, a shadowing effect furing the evaporation process step could occur, resulting in an incomplete crossover conductor. Furthermore, even if the shadowing effect would be avoided, weak points in the crossover conductor would occur at the junctions of the dielectric, substrate, and crossover conductor due to the sharp junction angle.

A great advantage provided by this invention involves the above-described junction, or more explicitly, the contact angle between the dielectric and the substrate. With the group of materials discovered to usefully form the crossover dielectric according to this invention, the contact angle depends on the wetting angle between the two materials. The contact angle is shown as $a$ in FIG. 2C.

In the example described above in which SYLGARD 187 (trademark) resin was used, the wetting angle was found to be between 11° and 30°. Clearly, this range of angles minimizes the shadowing and weakness problems described above. In fact, it is preferable that the contact angle be as small as possible consistent with potential breakdown requirements, leakage current, and capacitance between the crossover conductor and the underlying conductor. Thus the materials are useful both for thin film circuits, and thick film circuits where the crossover conductors are of thin film material.

Figure 3:
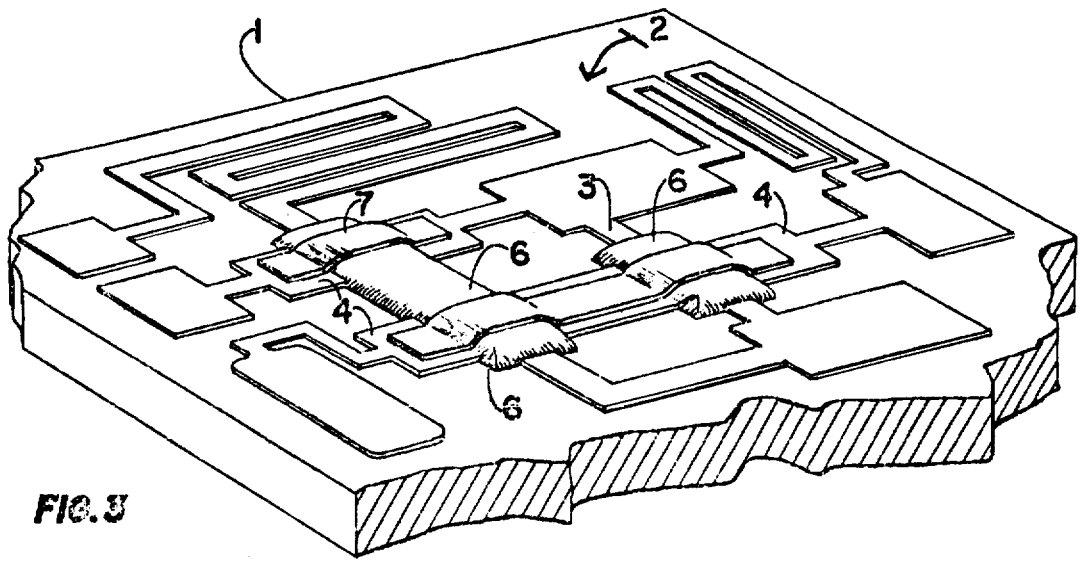
FIG. 3 is a perspective view of a portion of a thin film circuit using the crossovers according to this invention.

FIG. 3 shows a portion of a thin film circuit, in perspective, with a number of crossovers constructed according to this invention. First conductive elements 3, adherent to a substrate are to be crossed over. Conductive elements 4 and 5 which are to be joined across element 3 are adherent to the substrate, and are disposed adjacent each other on both sides of elements 3, but not touching them.

Low temperature curing resilient insulative dielectric 6 covers, and is adherent to, elements 3 where conductive crossovers are to cross, and is adherent to and makes contact with the substrate and elements 4 and 5 at an acute contact angle. It is preferred that the dielectric cover the first conductive elements 3 over an area having width greater than the width of elements 4 and 5, and breadth such as to overlap slightly the same elements.

Thin film conductive elements 7 are situated over the dielectric 6 and in contact with conductive elements 4 and 5 an amount sufficient to make adherent and conductive contacts. It is preferred, but not mandatory, that for ease of registration, that the thin film conductive elements 7 be narrower than elements 4 and 5. The dielectric thus supports fully the thin film conductive elements 7.

Figure 4:
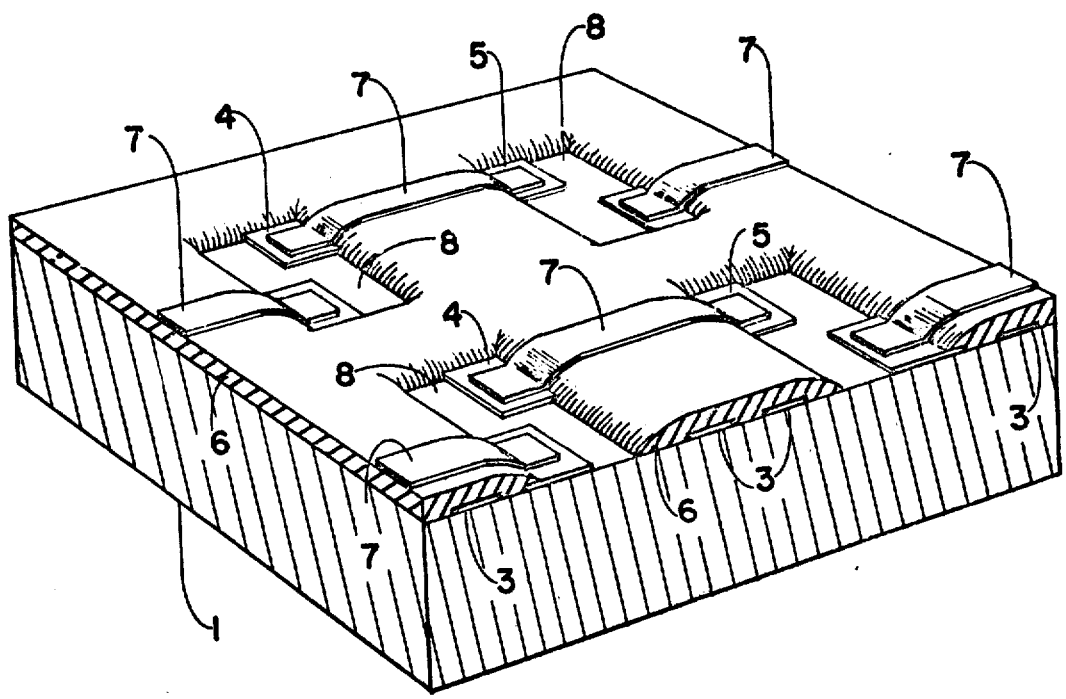
FIG. 4 is a perspective view of a section of a second embodiment of the invention, in a thin film circuit array.

A second embodiment of the invention is shown in FIG. 4. In this embodiment, which for example is particularly useful for the interconnection of an array, all the conductors and resistors are deposited as conductive elements 3, 4 and 5 on the substrate 1 as earlier described. However, in this embodiment, the entire surface of the substrate and elements 3, 4 and 5 are covered by a layer of dielectric 6, which may be screen printed in the normal way.

While in FIG. 4 elements 3, 4 and 5 are shown as thin film, they of course may alternatively be of thick film frit material.

Small areas 8 bare of dielectric are left at predetermined locations in order that crossovers may contact conductors appearing at the small areas 8. Thin film conductive elements 7 are disposed over the dielectric 6 between conductors 4 and 5 appearing within the small bare areas 8. Of course, the thin film conductive elements 7 may extend between more than conductors 4 and 5, and may form strips interconnecting a larger number of conductors.

Since the thin film conductive elements 7 are all deposited in a single evaporation step, a complex thin film or hybrid thin and thick film interconnected array may be produced by batch processing or other mass production techniques with high reliability and at low cost.

What is claimed is:
1. In a method of construction a thin film circuit, the steps of:
   a. sputtering a first conductive element selected from the group consisting of tantalum, titanium, nichrome, chromium and nickel and depositing second and third conductive elements on opposite sides thereof to one surface of an electrically insulative substrate,
   b. screen printing a layer of a low temperature curing insulative dielectric across the first conductive element through a first mask,
   c. curing said dielectric, whereby a predetermined acute contact angle between said dielectric and said substrate is formed, and
   d. sputtering a thin film conductive element over the dielectric between, and in contact with, the second and third conductive elements.

2. A method of constructing a thin film circuit as defined in claim 1, in which step (d) comprises:
   i. applying a second mask over said substrate and
   ii. sputtering the thin film conductive element through the second mask.

3. A method of constructing a thin film circuit as defined in claim 2 in which step (a) comprises sputtering first, second, and third thin film conductive elements to an electrically insulative substrate, and defining the elements by etching through a photolithographic mask.

4. A method of constructing a thin film circuit, as defined in claim 2, in which step (a) comprises first evaporating a layer of nichrome approximately 500 angstroms thick, then evaporating a layer of gold approximately 7,000 angstroms thick over the layer of nichrome, then defining the first, second, and third conductive elements by etching through a photoresist mask; and in which step (b) comprises screen printing a strip of silicone rubber across the first conductive element about 0.0015 to 0.002 inches thick over the first conductive element, whereby an acute contact angle between the silicone rubber and the substrate or first conductive element results.

* * * * *